Figure 1:
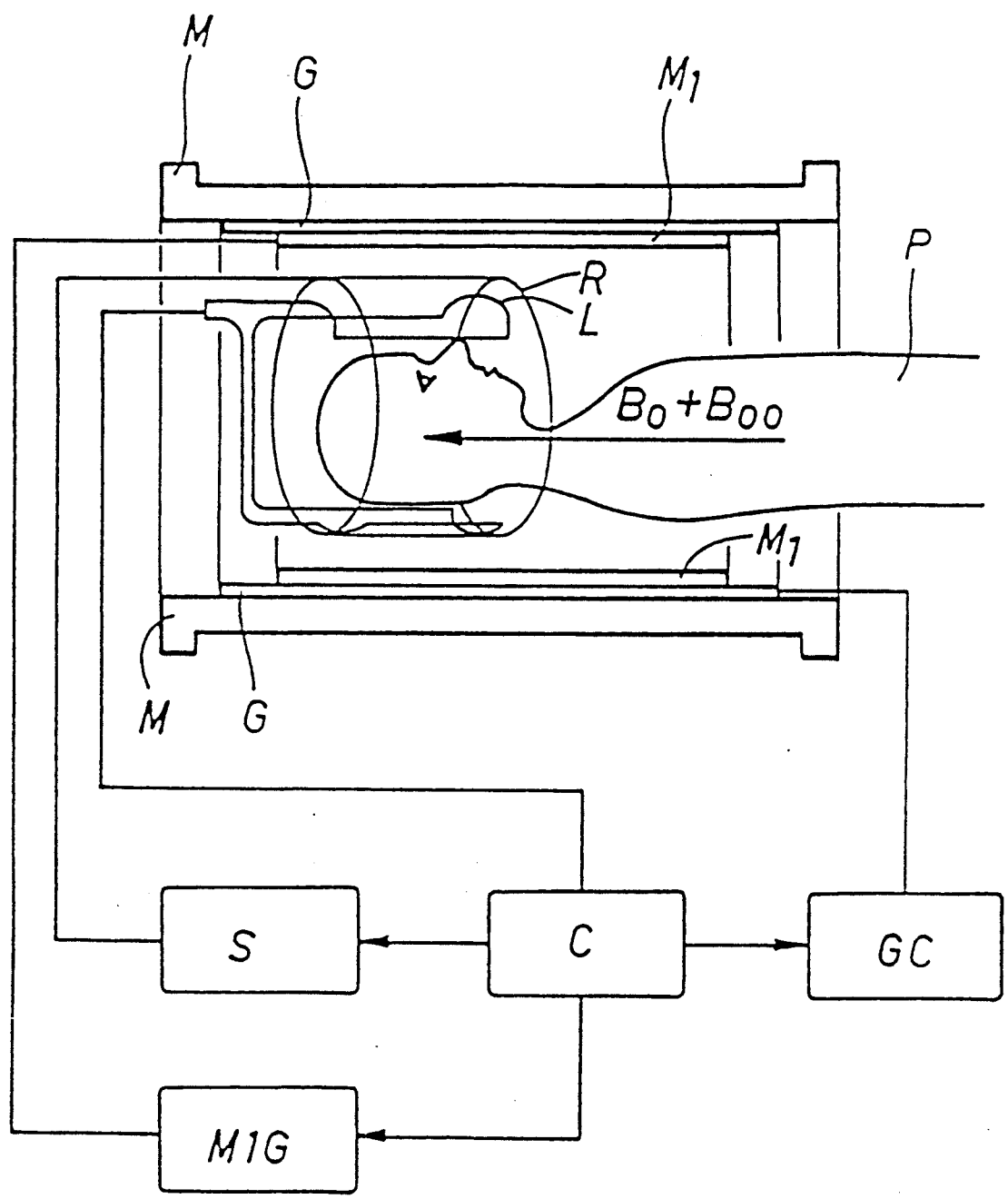

United States Patent [19]

Sepponen

[11] Patent Number: 5,162,738
[45] Date of Patent: Nov. 10, 1992

[54] COIL AND COUPLING ARRANGEMENT

[75] Inventor: Raimo Sepponen, Helsinki, Finland

[73] Assignee: Instrumentarium Corp., Finland

[21] Appl. No.: 606,571

[22] Filed: Oct. 31, 1990

[30] Foreign Application Priority Data

Nov. 27, 1989 [FI] Finland .................................. 895650

[51] Int. Cl.[5] .............................................. G01R 33/20
[52] U.S. Cl. ...................................... 324/318; 324/322
[58] Field of Search ................ 324/300, 307, 309, 311, 324/312, 313, 314, 319, 320, 318, 322

[56] References Cited

U.S. PATENT DOCUMENTS

| 3,052,834 | 9/1962 | Schuster | 324/313 |
| 3,646,429 | 2/1972 | Takeuchi et al. | 324/314 |
| 3,774,103 | 11/1973 | Laukien | 324/313 |

Primary Examiner—Michael J. Tokar
Attorney, Agent, or Firm—Andrus, Sceales, Starke & Sawall

[57] ABSTRACT

The invention relates to a coil and coupling arrangement for use in equipment based on magnetic resonance, which arrangement can be applied e.g. to magnetic resonance imaging (MRI). The apparatus is adapted to operate on more than one polarizing magnetic field strength and the apparatus includes a coil arrangement for producing and detecting a resonance signal as well as for changing the energy states of spin systems. The operating states and physical properties, such as e.g. the resonance frequency, of the coil arrangement are changed by using switches or couplings whose state is controlled by the polarizing magnetic field.

4 Claims, 2 Drawing Sheets

COIL AND COUPLING ARRANGEMENT

The present invention relates to a coil for use in equipment based on e.g. magnetic resonance imaging and magnetic resonance—and to coupling means associated therewith.

Magnetic resonance imaging (MRI) is a method which utilizes the nuclear magnetic resonance phenomenon (NMR) for detecting the local distributions of the nuclear density or nucleus-related NMR properties of an object or the physical and chemical properties bearing an effect thereon. Such NMR properties include e.g.: longitudinal relaxation (characterized by longitudinal relaxation time T1), transverse relaxation (characterized by transverse relaxation time T2), relaxation in a rotating frame of reference (characterized by relaxation time T1rho)), chemical shift, coupling factors between nuclei. NMR properties are effected upon by physical phenomena, including: flow rate, diffusion, paramagnetic materials, ferromagnetic materials, viscosity and temperature. The methods and applications of magnetic resonance and magnetic resonance imaging are described in a number of references: Wehrli FW, Shaw D, Kneeland BJ: Biomedical Magnetic Resonance Imaging, VCH Publishers, Inc., New York 1988, Stark DD and Bradley WG: Magnetic resonance imaging, C. V. Mosby Comp., St. Louis 1988, Gadian DG: Nuclear magnetic resonance and its applications to living systems, Oxford Univ. Press, London 1982, Shaw D: Fourier transform NMR spectroscopy, Elsevier, Amsterdam, 1984, Battocletti JH: NMR proton imaging, CRC Crit. Rev. Biomed. Eng. vol. 11, pp. 313–356, 1984, Mansfield P and Morris PG: NMR imaging in biomedicine, Adv. in magnetic resonance, Academic Press, New York 1982, Abragam A: The principles of nuclear magnetism, Clarendon Press, Oxford 1961, Lasker SE and Milvy P (eds.): Electron spin resonance and nuclear magnetic resonance in biology and medicine and magnetic resonance in biological systems, Annals of New York Academy of Sciences vol. 222, New York Academy of Sciences, New York 1973, Sepponen RE: Discrimination and characterization of biological tissues with magnetic resonance imaging: A study on methods for T1, T2, T1rho and chemical shift imaging, Acta Polytechnica Scandinavica EL-56, Helsinki 1986, Fukushima E and Roeder SB: Experimental pulse NMR, Addison Wesley, London 1981, Thomas SR and Dixon RL (eds.): NMR in medicine: The instrumentation and clinical applications, Medical Physics Monograph No. 14, American Institute of Physics, New York 1986. Anderson WA et al: U.S. Pat. No. 3,475,680, Ernst RR: U..S Pat. No. 3,501,691, Tomlinson BL et al: U.S. Pat. No. 4,034,191, Ernst RR: U.S. Pat. No. 3,873,909, Ernst RR: U.S. Pat. No. 4,070,611, Bertrand RD et al: U.S. Pat. No. 4,345,207, Young IR: U.S. Pat. No. 4,563,647, Hofer DC et al: U.S. Pat. No. 4,110,681, Savelainen MK: Magnetic resonance imaging at 0.02 T: Design and evaluation of radio frequency coils with wave winding, Acta Polytechnica Scandinavica Ph 158, Helsinki 1988, Sepponen RE: U.S. Pat. No. 4,743,850, Sepponen RE: U.S. Pat. No. 4,654,595, Savelainen MK: U.S. Pat. No. 4,712,068, Sepponen RE: U.S. Pat. No. 4,587,493, Savelainen MK: U.S. Pat. No. 4,644,281 and Kupiainen J: U.S. Pat. No. 4,668,904. Dynamic nuclear polarization has been described e.g. in the following references: Lepley AR and Closs GL: Chemically induced magnetic polarization, Wiley, New York 1973, Potenza J: Measurement and Applications of dynamic nuclear polarization, Adv. Mol. Relaxation Processes vol. 4, Elsevier, Amsterdam 1972, pp. 229–354, Ettinger KV: U.S. Pat. No. 4,719,425.

DNP is a magnetic double resonance method which thus requires two separate spin populations. Such spin populations include e.g. the spins of electrons and protons. In the double resonance method the distribution of one spin population on various energy levels is varied and the other spin population is under observation. As certain conditions are met, the resonance signal of a spin population being observed increases. The amplified signal may have an amplitude which is several hundred times higher than the non-amplified signal. The amplification factor can be positive or negative. The amplified signal is characteristically highly sensitive to the physico-chemical properties and reactions of a spin environment, so its use is obvious for the examination of the chemical properties of a material. The reference Ettinger KV: U.S. Pat. No. 4,719,425 discloses as applications the mapping of the concentrations of paramagnetic components and the mapping of the activity of cerebral nerve cells. The references Lurie DJ, Bussel DM, Bell LH, Mallard JR: Proton Electron Double Resonance Imaging: A new method for imaging free radicals, Proc. S.M.R.M. Fifth Annual Meeting, 1987, New York, p. 24 and Lurie DJ, Bussel DM, Bell LH, Mallard JR: Proton-Electron Double Magnetic Resonance Imaging of free radical solutions, J. Magn. Reson., vol. 76, 1988, pp. 366–370 disclose as possible applications the mappings of free radical groups, nitroxide radicals and a degree of oxidation.

According to the prior art and in reference to FIG. 1, an object P to be examined is placed in a magnetic field $B_o$ as homogeneous as possible (so-called polarizing magnetic field), the apparatus further including a signal coil C for detecting an NMR signal coupled with an NMR spectrometer L, a resonator arrangement R for irradiating the object with a magnetic field having a frequency equal to the electron spin resonance (ESR), said arrangement R being provided with an oscillator and a power amplifier system S, the apparatus being equipped, for encoding the positional information, with a gradient coil assembly G, the current required thereby being produced by spectrometer-controlled gradient current sources GC.

In the prior art, the electron spin system is saturated by irradiating an object at a frequency which corresponds to the ESR frequency in field Bo and by detecting an NMR signal at a frequency which corresponds to field strength Bo. Thus, for example, The Bo strength of 0.04 T used in the cited references is matched by the ESR frequency of 1.12 GHz and the NMR frequency of 1.7 MHz.

It is also prior known to effect the saturation of an electron spin system in a different field from the observation of a nuclear magnetic resonance signal. When the object has a large diameter relative to the radiation wavelength, which is the case e.g. in the examination of a human body, the alteration of a field results in substantial safety and technical benefits. Such solution and its benefits are described in the references Sepponen RE: FI Pat Appln 883153 and Lurie DJ, Hutchison JMS, Bell LH, Nicholson I, Bussel DM, Mallard JR: Field-Cycled Proton-electron Double Resonance Imaging of Free Radicals in Large Aqueous Samples, J. Magn. Reson., vol. 84, pp. 431–437, 1989. It is prior known to employ electrically or optically controlled semi conductor switches as well as pneumatically or electrically controlled relays for changing the excitation of necessary radiofrequency energy transmitting the field. The above-described switches may shut off a part of the electric circuit of a coil system in a manner that said part is not coupled with the rest of the coil system to avoid a further loading thereof.

A drawback in the prior art is that the operation of semi conductor switches is incomplete (transmitting resistance is relatively high and reverse resistance is relatively low). Through the intermediary of required switching circuits, the signal coil system receives noise and, thus, the number of switches or couplings should be maintained as few as possible. A drawback in electrically controlled relays is that the control circuit transmits noise to signal coil systems. A drawback in pneumatically controlled switches is their slow action and technical complicity of the arrangement. The complicity increases if a major frequency alteration is required, which may be the case when utilizing the DNP phenomenon.

The invention set forth in the claims is capable of avoiding the prior art drawbacks and enables unhampered disposition of switches in a coil arrangement without any control circuits.

The invention is illustrated in the accompanying drawings, in which

Figure 2:
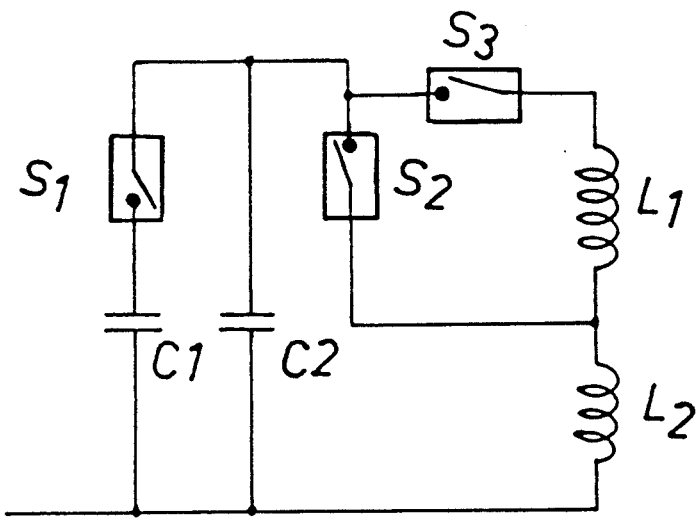
Figure 3:
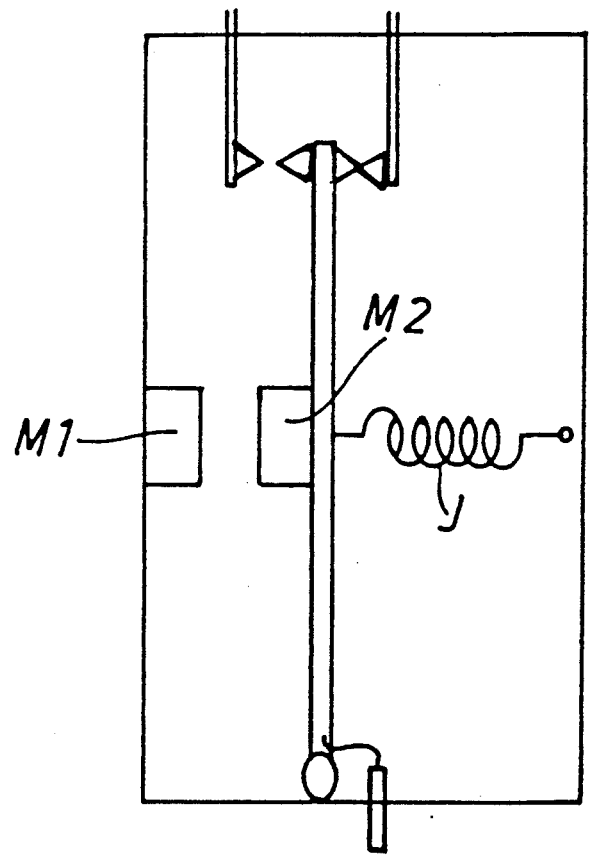

FIG. 1 shows a per se known solution for an imaging apparatus based on the magnetic resonance phenomenon, wherein the strength of a polarizing magnetic field is changed, FIG. 2 shows one coil arrangement of the invention, and FIG. 3 shows one practical embodiment for a switching controlled by the strength of a polarizing magnetic field.

FIG. 1 illustrates one basic solution for an imaging apparatus based on magnetic resonance, wherein the strength of a polarizing magnetic field is changed. The operation of such apparatus is controlled by a computer C which controls the excitation and signal collection procedures, the operation of signal electronics S as well as that of coil means R and L and also gradient operations, such as a gradient current source GC which supplies current to a gradient coil system G as well as a magnetic current source M1G which supplies current to a magnetic coil system M1. A magnet M produces a polarizing magnetic field component Bo and M1 produces a polarizing magnetic field component Boo.

Referring to FIG. 2, an apparatus of the invention is designed as follows: The coil arrangement comprises coil windings L1 and L2 as well as tuning capacitors C1 and C2. When the apparatus is operating on a low frequency, e.g. when monitoring a NMR signal, coils L1 and L2 are coupled in series and C1 and C2 in parallel. A resonance circuit is made up of an inductance L1+L2 and a capacitance C1+C2. When operating at a higher frequency, for example when transmitting radiofrequency energy for the saturation of electron spins, a coil winding L1 is electrically switched off by means of switches S2 and S3 and capacitor C1 is switched off by means of a switch S1 so as not to load other coil means. At a higher frequency, L1 and C1 are in resonance. The coupling procedures are effected by switches S1, S2 and S3 of the invention controlled by the strength of a polarizing magnetic field.

FIG. 3 illustrates one embodiment of the invention for a switch or a coupling controlled by the strength of a magnetic field. The magnetizable, e.g. soft-iron pieces M1 and M2 are magnetized in an external magnetic field and, thus, an attraction effect is produced therebetween. A spring J works in the direction opposite to the direction of the resulting magnetic attraction. When the magnetic attraction overcomes the spring force, the switch reverses its present state. By adjusting the spring force it is possible to select the strength of an external magnetic field at which the switching or coupling occurs.

The above specfication of the invention only describes one embodiment of the invention. It is prior known, for example, that the capacitances of coil equipment are controllable, designed entirely or partially by using e.g. varactors or capacitance diodes and the fine tuning is effected under the control of e.g. a NMR signal. Other possibilities are conceivable as well, for example, the alteration of the strength of a polarizing magnetic field is understood to include also the reversal of its direction.

I claim:

1. Apparatus that detects magnetic resonance signals in an object, said object having energy states of its spin systems, comprising:
   coil means for producing and detecting a resonance signal from said object and for changing the energy states of the spin systems of said object, said coil means having a plurality of operating states;
   switch means for changing the operating states of said coil means; and
   switch control means for controlling the switching of said switch means using a polarized magnetic filed.

2. The apparatus of claim 1, wherein said coil means transmits spin system saturating radio frequency energy when said coil means is in a first operating state, and wherein said coil means receives a magnetic resonance signal when said coil means is in a second operating state.

3. The apparatus of claim 1, wherein said coil means includes a first coil winding and a second coil winding, and wherein said switch means switches off said first coil winding to substantially prevent further loading on said second coil winding.

4. The apparatus of claim 2, wherein said coil means includes a first coil winding and a second coil winding, and wherein said switch means switches off said first coil winding to substantially prevent further loading on said second coil winding.

* * * * *